United States Patent
Miyawaki et al.

(10) Patent No.: US 7,141,970 B2
(45) Date of Patent: Nov. 28, 2006

(54) MAGNETIC RESONANCE IMAGING DEVICE

(75) Inventors: Shouichi Miyawaki, Kashiwa (JP); Hiroyuki Takeuchi, Kashiwa (JP); Hideki Kumai, Kashiwa (JP)

(73) Assignee: Hitachi Medical Corporation, Tokyo (JP)

(*) Notice: Subject to any disclaimer, the term of this patent is extended or adjusted under 35 U.S.C. 154(b) by 43 days.

(21) Appl. No.: 10/518,122

(22) PCT Filed: Jul. 3, 2003

(86) PCT No.: PCT/JP03/08487

§ 371 (c)(1),
(2), (4) Date: Dec. 16, 2004

(87) PCT Pub. No.: WO2004/004563

PCT Pub. Date: Jan. 15, 2004

(65) Prior Publication Data
US 2005/0218894 A1    Oct. 6, 2005

(30) Foreign Application Priority Data
Jul. 4, 2002    (JP) .............................. 2002-196272

(51) Int. Cl.
    *G01V 3/00*    (2006.01)
(52) U.S. Cl. ..................... 324/307; 324/309
(58) Field of Classification Search .............. 324/307
    See application file for complete search history.

(56) References Cited

U.S. PATENT DOCUMENTS 4,698,591 A    10/1987  Glover et al.
5,352,979 A *  10/1994  Conturo .................. 324/307
5,770,943 A *  6/1998   Zhou ...................... 324/307
6,335,620 B1 * 1/2002   Weissenberger ........... 324/307

FOREIGN PATENT DOCUMENTS

| JP | 2-177940   | 7/1990 |
| JP | 7-148137   | 6/1995 |
| JP | 2000-262485 | 9/2000 |

OTHER PUBLICATIONS

Terpstra et al. "Localized Eddy Current Compensation Using Quantitative Field Mapping", Journal of Magnetic Resonance 131 (1998) p. 139-143.*

(Continued)

*Primary Examiner*—Louis M. Arana
(74) *Attorney, Agent, or Firm*—Cooper & Dunham LLP (57) ABSTRACT

An MRI apparatus having a calibration pulse sequence, wherein a group of pulse sequences for applying test gradient magnetic fields are established from a basic pulse sequence by a gradient echo method of short TR, a group of pulse sequences not applying test gradient fields are established from the basic pulse sequence, a set of three- or four-dimensional data including a time variable is created by using echo signals collected by at least one of the groups, two data sets are created as a whole by inverting the polarity of the test gradient magnetic field, the difference between phase images thereof is determined, the magnitude and time constant of eddy current induced at the fall or rise of the gradient magnetic field are determined from the phase difference image, and the variation of the magnetic field due to eddy current induced at the rise and/or fall of the gradient magnetic field can be measured in a relatively short time with a desired time resolution even if the magnetic field variation is of a very long time constant.

23 Claims, 5 Drawing Sheets

OTHER PUBLICATIONS

Cohen MS, "Echo Planar Imaging (EPI) and functional MRI", http://airto.bmap.ucla.edu/BMCweb/BMC_BIOS/MarkCohen/Papers/EPI-fMRI.html, 1998.*

Schiff, J. et al. (1994) "New Efficient Eddy-Field-Mapping Procedure (FAME)", Journal Of Magnetic Resonance, Series B 104, pp. 73-76.

* cited by examiner

MAGNETIC RESONANCE IMAGING DEVICE

FIELD OF THE INVENTION

The present invention relates to a magnetic resonance imaging apparatus (hereinafter will be called "MRI apparatus") which makes use of nuclear magnetic resonance phenomenon and permits a tomographic image to be obtained of any desired positions of a subject, and in particular, relates to a technology for preventing image quality deterioration such as image distortion, signal intensity reduction and ghosting which is caused by a gradient magnetic field waveform distortion due to eddy current induced by an application of gradient magnetic field.

BACKGROUND ART

An MRI apparatus utilizes a nuclear magnetic resonance phenomenon to measure various parameters of atomic nuclei (usually proton) in any desired regions of a subject. Typically, a high frequency magnetic field is applied to the subject placed in homogeneous static magnetic field to obtain a tomographic image of the region from nuclear magnetic resonance signals (echo signals) induced thereby. In order to select a specific region, a gradient magnetic field is applied together with the high frequency magnetic field and further, in order to provide correct positional information for the echo signals measured, it is necessary to correctly control the application time and intensity of the gradient magnetic field.

However, actually due to the gradient magnetic field application, currents with damping property are induced in a variety of structural bodies around gradient magnetic coils. Such current induced with damping property is called as eddy current, which shows a different time constant component depending on types of magnets used for static magnetic field generation. For example, a time constant of a permanent magnet type apparatus is about 1 sec. and a time constant of a superconductive magnet type apparatus reaches up to about 2 sec. These eddy currents generate magnetic field varying spatially and temporally and cause to deviate the gradient magnetic field sensed by nuclear spins in the subject from an ideal condition. Thereby, reduction of image quality such as image distortion, signal intensity reduction and ghosting is induced.

In order to prevent such image quality reduction due to eddy currents, a method has been developed, in which the spatially and temporally varying magnetic field is measured and the magnetic field variation is compensated. For example, JP-A-10-272120 discloses a technology in which a phantom is disposed in a static magnetic field space, after applying a test gradient magnetic field a high frequency pulse is applied, NMR signals caused thereby are measured, magnetic field variation due to eddy currents caused by the application of the test gradient field is measured along with discrete time lapse, compensation currents for compensating the magnetic field variation are respectively determined and an influence affected to the magnetic field by the gradient field applied at the time when taking an image of a subject is avoided.

In the above method, after applying the test gradient magnetic field, nuclear spins in the phantom are excited by high frequency (RF) pulses and phase encoded free induction decay signals (FID signals) are sampled in a predetermined period. The measurement of the FID signals is repeated by varying the phase encode amount and a set of data of two dimensions or three dimensions is obtained. The FID signals contain, other than the eddy currents induced by the test gradient magnetic field, influences of inhomogeneity of the static magnetic field and eddy current due to the phase encoding gradient magnetic field. Thus, by changing the polarity of the test gradient magnetic field, a similar measurement is performed to obtain another set of data, through taking difference of the two sets of data obtained in the two measurements, the influences of inhomogeneity of the static magnetic field and eddy current due to the phase encoding gradient magnetic field are avoided. Thus, a phase difference image, which only contains the influence of eddy currents induced by the test gradient magnetic field, is obtained. Based on the phase difference image, magnitudes of the eddy currents are resolved spatially and temporally and their time constants are calculated and compensation currents to be flown in the gradient magnetic field coils and shim coils are calculated.

As has been explained above, in the conventional method, the following operation is repeated, in that after applying the test gradient magnetic field, the RF pulses of non-selectivity are applied, the phase encoding is performed in three axial directions, the FID signals are sampled along time lapse and four dimensional data containing time axis are obtained.

However, since the FID signals measured with the conventional art decay according to lapse of time, a level of NMR signals for measuring an eddy current having a long time constant reduces according to time, namely, since S/N reduces according to lapse of time, it is afraid that the measurement accuracy of eddy currents having a long time constant will be reduced.

Further, the eddy currents induced by the application of the gradient magnetic field are caused when the gradient magnetic field rises and falls and differences in the induced currents at the time when rising and falling of the gradient magnetic field application is sometimes caused due to such as vibration of structural bodies of magnet disposed around the gradient magnetic field coils. However, the measurement object in the above conventional art is limited only to the eddy current components induced at the time when the gradient magnetic field falls, and the conventional art does not disclose to measure the influence to the magnetic field due to the eddy current component induced when the gradient magnetic field rises and to compensate the same.

An object of the present invention is to provide an MRI apparatus which measures the eddy current components having a long time constant induced when the gradient magnetic field rises and/or falls and permits to compensate with a high accuracy the influence to the magnetic field caused thereby.

SUMMARY OF THE INVENTION

In the present invention which achieves the above object, a phantom is disposed in static magnetic field, gradient magnetic field having a predetermined intensity is applied in a predetermined gradient magnetic field application axis direction for a longer time than a time constant of an eddy current to be compensated, a pulse sequence is started which measures a spatial distribution of magnetic field in response to ON and/or OFF of the applied gradient magnetic field as well as the pulse sequence is repeated in a plurality of times with repetition time TR while changing phase encoding amount, a variation state of the magnetic field caused by the induced eddy current is measured from an image, a current value to be flown in to a magnetic field variation compensation coil is determined from the measured value for successively compensating variation state of the magnetic field and the determined current value for compensating the magnetic field variation is supplied to the magnetic field variation compensation coil when a pulse sequence for actually taking an image of a subject is performed.

Further, the gradient magnetic field applied for a longer time than the time constant of the concerned eddy current can be applied either in a form of actual value or in a form of effective value.

Still further, the spatial distribution of the magnetic field due to the eddy current caused by ON and/or OFF of the gradient magnetic field is measured in a plurality of times in an equal time interval along with lapse of time.

In a further preferred embodiment, for the measurement of spatial distribution variation of the magnetic field due to the eddy current caused when the gradient magnetic field is turned ON, through performing a pulse sequence for measuring echo signals containing application of a test gradient magnetic field in a plurality of times (n) with repetition time TR, an application of a gradient magnetic field having a longer time than the time constant of an eddy current to be compensated is substantially realized as well as the pulse sequence is performed repeatedly to obtain an MR image, a spatial distribution of the magnetic field due to the eddy current is measured from the obtained MR image, and then, a current value to be flown in to the magnetic field variation compensation coil for compensating the magnetic field spatial distribution is determined.

Further, for the measurement of spatial distribution variation of the magnetic field due to the eddy current caused when the gradient magnetic field is turned OFF, prior to the measurement of the magnetic field variation due to the eddy current, the pulse sequence for magnetic field measurement containing the magnetic field variation due to the eddy current caused when the gradient magnetic field is turned ON is performed while modifying the same so as not to measure the echo signals, following this pulse sequence a pulse sequence for measuring echo signals is repeatedly performed with the repetition time TR to obtain an MR image, a variation state of the magnetic field due to the eddy current is measured from the obtained MR image, and then, a current value to be flown in to the magnetic field variation compensation coil for compensating the magnetic field spatial distribution is determined.

Further, according to the present invention, a compensation of both influences when the gradient magnetic field is turned ON/OFF can be realized by performing in combination the measurement sequences when the gradient magnetic field is turned ON and OFF.

BEST MODE EMBODIMENTS FOR CARRYING OUT THE INVENTION

Embodiments of the present invention will be explained herein below.

Figure 1:
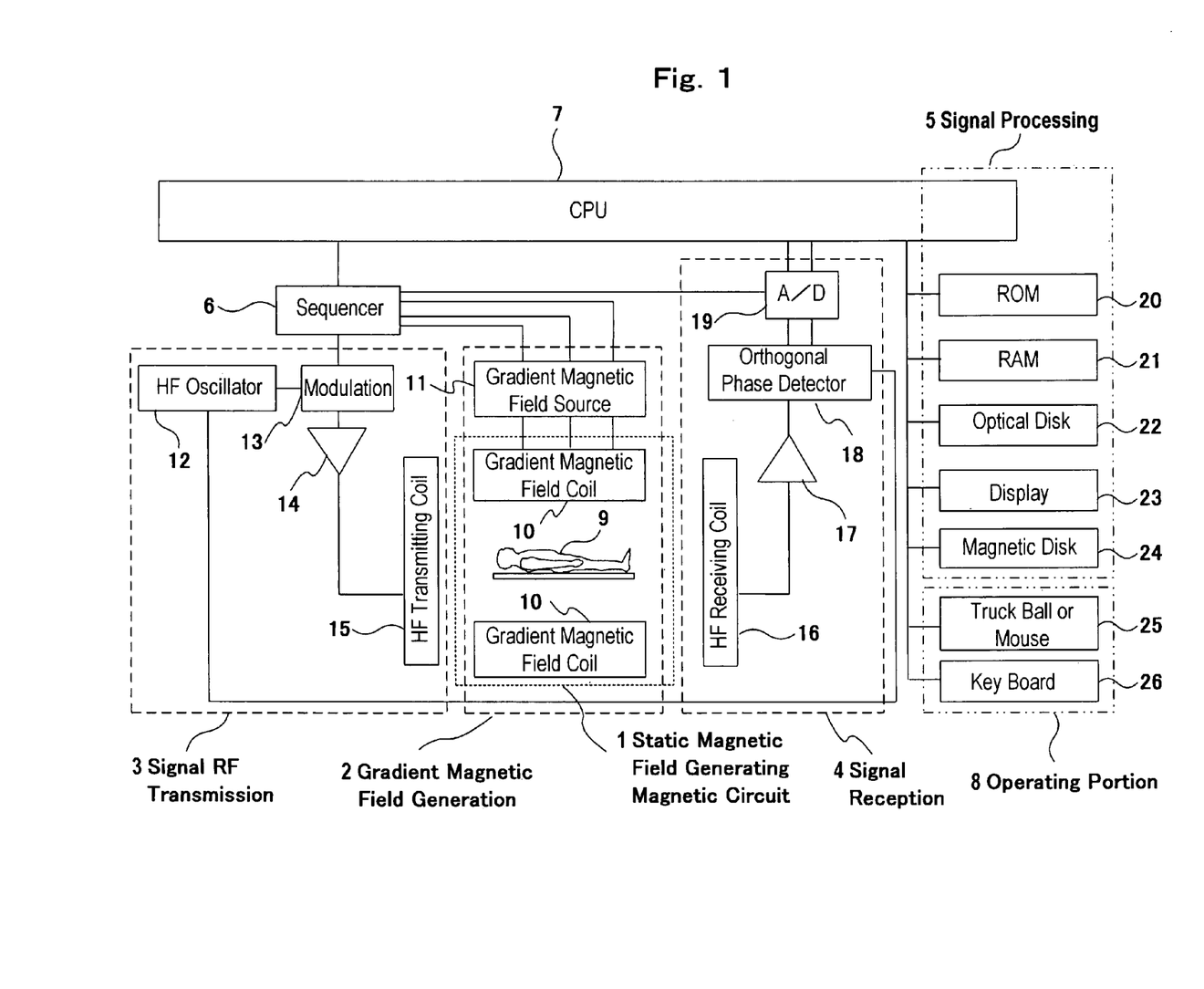
FIG. 1 is a diagram showing an outline of an MRI apparatus to which the present invention is applied.

FIG. 1 is a block diagram showing an entire outline of an MRI apparatus to which the present invention is applied. The MRI apparatus comprises, as its primary constituents, a static magnetic field generating magnetic circuit 1 for generating homogeneous static magnetic field in a space where a subject 9 is placed, a gradient magnetic field generating system 2 for providing magnetic field gradient to the static magnetic field, a signal transmission system 3 for generating high frequency (RF) magnetic field which causes nuclear magnetic resonance phenomenon in atomic nuclei (usually proton) of atoms constituting tissue of the subject 9, a signal receiving system 4 for receiving echo signals generated from the tissue of the subject 9 through the nuclear magnetic resonance phenomenon, a signal processing system 5 which processes the echo signals received by the signal receiving system 4 and reconstructs an image representing such as spatial density and spectrum of atomic nuclei in the tissue and a central processing unit (CPU) 7 which performs a variety of operations in the signal processing system 5 and of controls for the entire apparatus.

The static magnetic field generating magnetic circuit 1 is constituted by either a permanent magnet, a normal conductivity type magnet or a superconductivity type magnet, and generates a homogeneous static magnetic field around the subject 9 in its body axis direction or in the direction perpendicular to the body axis. The gradient magnetic field generating system 2 is constituted by gradient magnetic field coils being wound so as to generate gradient magnetic fields in three axial directions of x, y and z and gradient magnetic field power sources 11 which drive respective gradient magnetic field coils and through driving the gradient magnetic field power sources for the respective coils according to the command from a sequencer 6 which will be explained later, gradient magnetic fields Gx, Gy and Gz in three axial directions of x, y and z are applied to the subject 9. According to application manners of the gradient magnetic fields, an image taking object region (slice, slab) of the subject 9 can be set as well as positional information such as phase encoding and frequency encoding can be provided for the echo signals.

Further, although not illustrated, in the static magnetic field generating magnetic circuit 1 and the gradient magnetic field generating system 2, shim coils (such as x-y coils and $z^2$ coils) are disposed for compensating variation in magnetic field induced by such as inhomogeneity of static magnetic field and eddy currents due to the gradient magnetic field. Further the gradient magnetic field coils 10 function as shim coils for correcting first orders thereof.

The signal transmission system 3 is for irradiating a high frequency magnetic field (RF pulses) for causing nuclear magnetic resonance phenomenon in atomic nuclei of atoms constituting the living body tissue of the subject 9 by means of the high frequency pulses sent out from the sequencer 6 and is constituted by a high frequency oscillator 12, a modulator 13, a high frequency amplifier 14 and a high frequency coil 15 at the signal transmission side. In the signal transmission system 3, the high frequency pulses output from the high frequency oscillator 12 are amplitude modulated by the modulator 13, after amplifying the amplitude modulated high frequency pulses by the high frequency amplifier 14, the same are supplied to the high frequency transmitting coil 15, thereby, high frequency magnetic field (RF electro magnetic pulses) are irradiated to the subject 9.

The signal receiving system 4 is for detecting echo signals (NMR signals) sent out from the subject 9 through nuclear magnetic resonance phenomenon and is constituted by a high frequency receiving coil 16 at the signal receiving side, an amplifier 17, an orthogonal phase detector 18 and an A/D converter 19. In the signal receiving system, echo signals detected by the high frequency receiving coil 16 are input via the amplifier 17 and the orthogonal phase detector 18 in to the A/D converter 19 to convert the same in to digital signals and are sent to the signal processing system 5 as collected data in two series.

The signal processing system 5 is constituted by a CPU 7, a ROM 20, a RAM 21, a recording device such as an optical disk 22 and a magnetic disk 24 and a display such 23 as a CRT, and the CPU 7 performs such as Fourier transformation, correction coefficient calculation and image reconstruction processing and displays the obtained image on the display 23. The ROM 20 stores such as programs for performing image analysis processing and measurement and parameters used when executing the programs. The RAM 21 stores temporarily such as measurement parameters obtained during preliminary measurement, echo signals obtained by the signal receiving system 4 and images used for setting a region of interest as well as stores such as parameters for setting the region of interest. The optical disk 22 and the magnetic disk 24 work as a data storage portion for storing images reconstructed at the CPU 7. An operating portion 8 is for an operator inputting such as selection commands and parameters of a pulse sequence for image taking as well as for inputting control information of the processing performed in the signal processing system 5 and is constituted by such as a truck ball or a mouse 25 and a keyboard 26.

Other than the above operations, the CPU 7 sends via the sequencer 6 a variety of commands necessary for data collection for a tomographic image of the subject 9 to the gradient magnetic field generating system 2, the signal transmission system 3 and the signal receiving system 4. The sequencer 6 controls the gradient magnetic field generating system 2, the signal transmission system 3 and the signal receiving system 4 according to a pulse sequence which is a time chart for a predetermined control determined by the concerned image taking method and controls data collection necessary for image reconstruction.

The pulse sequence of the MRI apparatus according to the present invention includes, other than a usual image taking pulse sequence, a calibration pulse sequence for measuring eddy currents induced by gradient magnetic field which is performed, for example, at the time of installation of the MRI apparatus, at the time of reconstruction and at the time of parts exchange and these pulse sequences are installed in the ROM 20 as programs.

Figure 2:
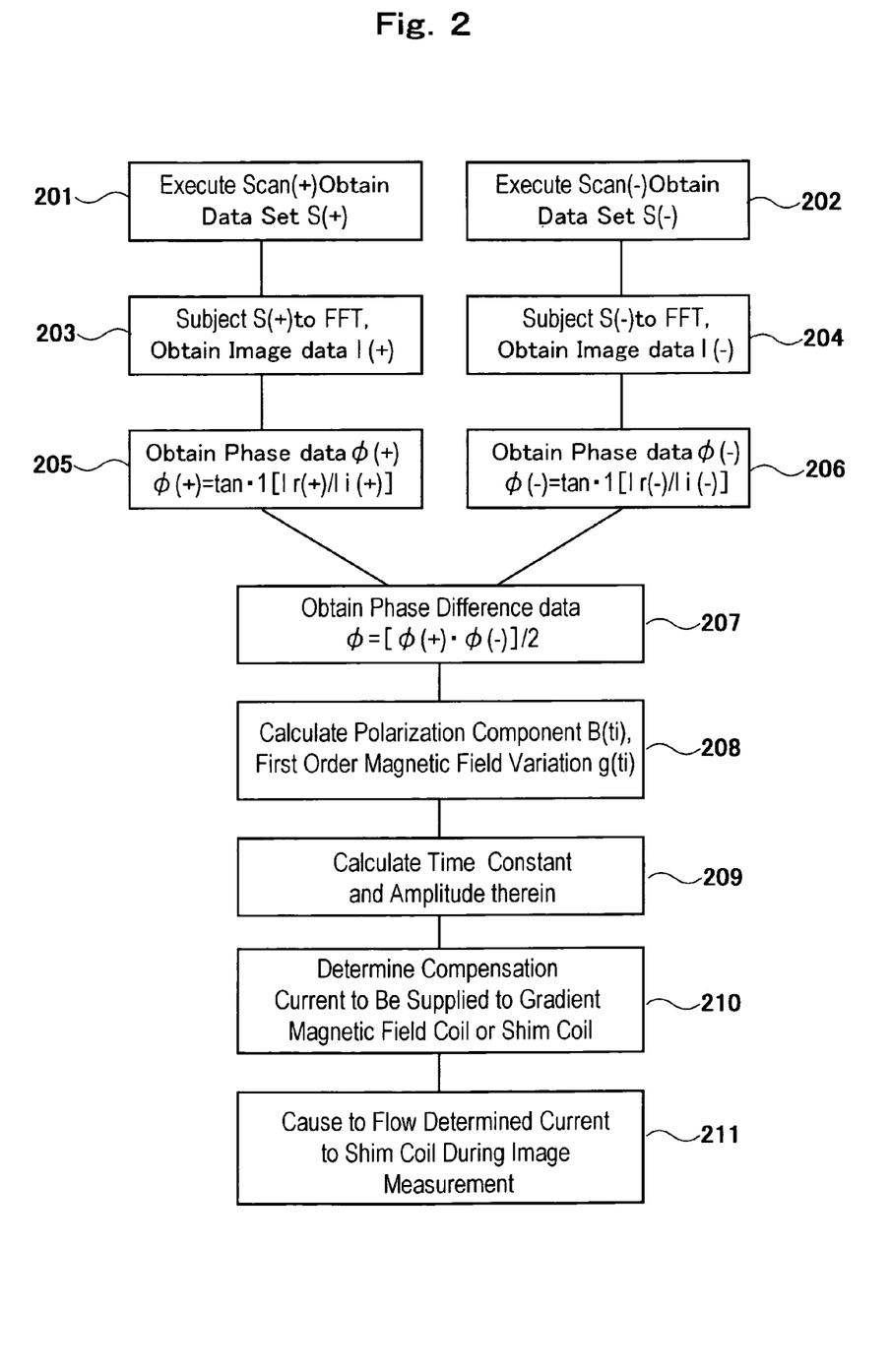
FIG. 2 is a flowchart showing an example of sequences for measuring eddy currents and for compensating magnetic field variation based on the measurement in the MRI apparatus according to the present invention.
Figure 3:
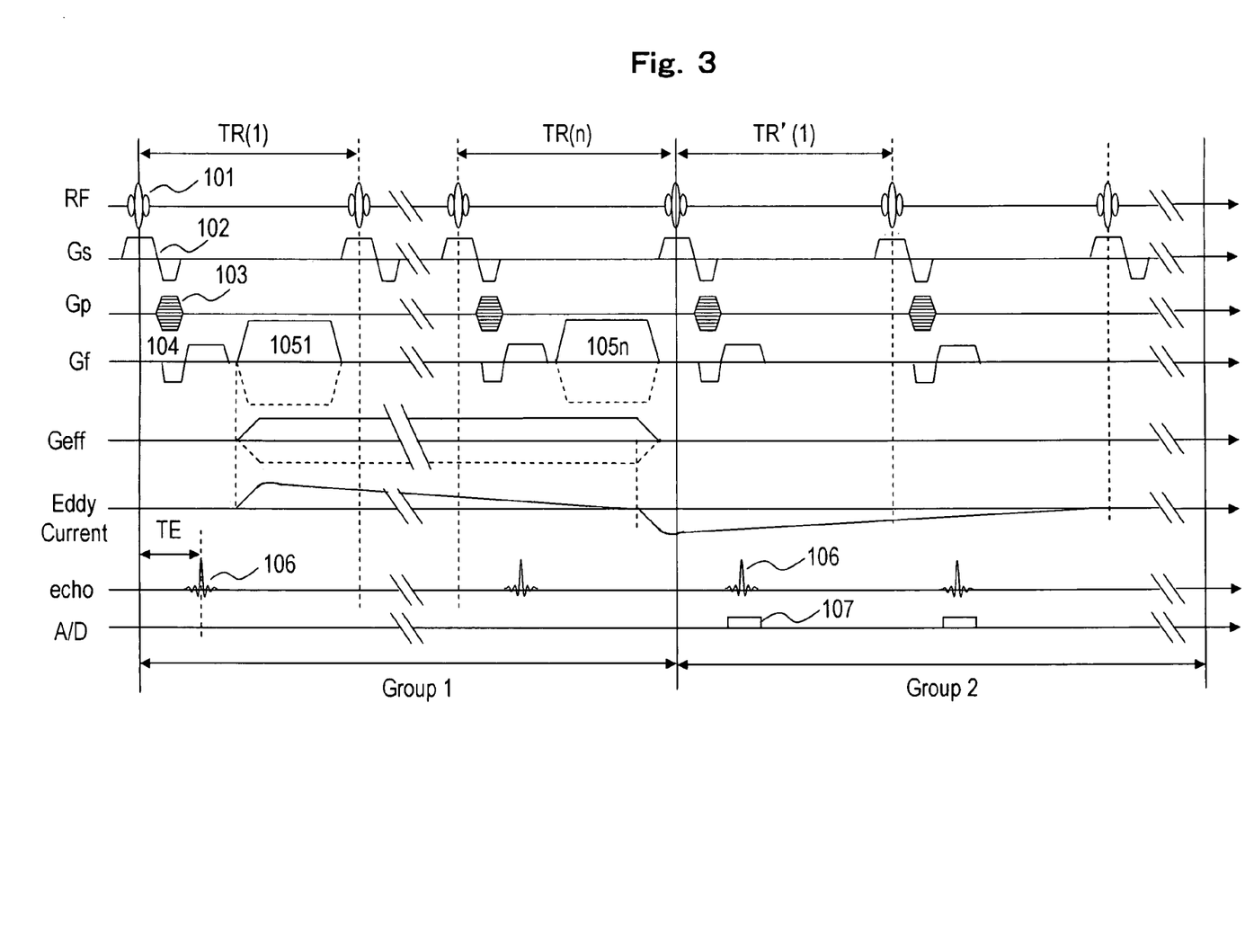
FIG. 3 is a diagram showing an example of calibration pulse sequences provided in the MRI apparatus according to the present invention.

Now, measurement of the eddy currents performed by the MRI apparatus with such constitutions and compensation method of the magnetic field variation based on the measurement will be explained. FIG. 2 is a flowchart showing a sequence of the eddy current measurement and the compensation of the magnetic field variation based on the measurement, and FIG. 3 is a diagram showing an example of calibration pulse sequences for measuring temporal and spatial magnetic field variation induced by the eddy currents. The illustrated calibration pulse sequence shows one suitable for measuring eddy currents induced when the gradient magnetic field falls, and for measuring eddy currents induced when the gradient magnetic field rises, a modified pulse sequence thereof can be used. The manner of the modification will be explained later.

At first, by executing the calibration pulse sequence, the eddy current measurement is performed (steps 201~207). The measurement is performed after arranging a usual phantom at the center of the static magnetic field. As the phantom, a spherical one is preferable for minimizing influence of magnetic susceptibility.

As shown in FIG. 3, the calibration pulse sequence is based on a short TR pulse sequence according to a gradient echo method and is constituted by a unit in which a test gradient magnetic field is applied (herein after called as group 1) and another unit in which no test gradient magnetic field is applied (herein after called as group 2).

At first, the measurement of eddy current induced when the gradient magnetic field falls will be explained. In this instant, the unit of group 1 exists for applying the test gradient magnetic field. The test gradient magnetic field is required to be applied with a predetermined intensity in a predetermined axial direction, in the most simple manner, the test gradient magnetic field is required to be applied at least once prior to the group 2, moreover, the test gradient magnetic field is required to be applied so that the gradient magnetic field falls after the eddy currents induced when the gradient magnetic field rises have disappeared. For this purpose, as the gradient magnetic field indicated by Geff in FIG. 3, if the time constant of an eddy current of the measurement object is, for example, 2 sec., it is required to apply a gradient magnetic field for an interval more than 2 sec. However, in order that a gradient magnetic field is generated for a long time such as 2 sec., since a large current has to be flown for a long time in the gradient magnetic field coils, it is afraid that adverse influences thereby, for example, such as the heat generated in the gradient magnetic field coils and deformation and disconnection of the gradient magnetic field coils by the heat are caused.

Therefore, in the present embodiment, the test gradient magnetic field is divided in a pulse shape and is applied in a divided manner in a plurality of times so that an effective gradient magnetic field Geff is applied in a temporally continued manner. Thereby, the turning OFF of the gradient magnetic field can be realized after the eddy current induced when the gradient magnetic field rises has disappeared, accordingly, it is designed that only the eddy current induced when the gradient magnetic field falls can be measured in the group 2. Herein below, under the precondition of the above explanation, the sequence will be explained in more detail.

In the group 1 unit of the pulse sequence, by making use of an RF excitation pulse 101 and a slice selection gradient magnetic field 102 any desired cross section of a phantom is excited, after encoding in phase direction the excited nuclear spins through application of a phase encode gradient magnetic field 103, and after causing to generate an echo signal 106 through application of a read out direction gradient magnetic field 104 (however, the echo signal is not sampled), a test gradient magnetic field 1051 having a predetermined intensity and a predetermined application time is applied. The same sequence is repeated with a repetition time TR (for example, TR=10 msec.) in a plurality of times (n times, for example, n=300), and through the repetition of the sequence, the test gradient magnetic fields from 1052 (not illustrated) to 105$n$ are applied. Accordingly, time for executing the group 1 once is required for 3 sec. During this repetition, the phase encode gradient magnetic field 105 is kept at a same application amount. When assuming the intensity and the application time of the test gradient magnetic field 105 as Gtest and tG, the gradient magnetic field which the nuclear spins felt by the test gradient magnetic fields 105 repeatedly applied in group 1 is substantially equivalent as those when the gradient magnetic field having effective magnetic field intensity of Geff=Gtest×tG/TR is continuously applied for time TR×n times. When assuming that the repetition time TR is 10 msec. and n is 300, since it is assumed that the effective gradient magnetic field Geff is continuously applied for an interval of about 3 sec., it is considered that the eddy current having time constant of 2 sec. which is induced when the effective gradient magnetic field Geff rises has disappeared at the time when the effective gradient magnetic field Geff falls. Further, the eddy currents due to the application of the test gradient magnetic fields 105, in that due to Geff are induced at the time when rising of Geff application and falling thereof, and damp as shown in FIG. 3.

In the group 1, since the gradient echo sequence including the slice selective RF excitation is repeatedly performed 300 times exceeding 100 times with the short repetition time of 10 msec., the nuclear spins in the region repeatedly subjected to the selective excitation within the phantom are placed in a steady state free precession (SSFP) state and an advantage is achieved that the echo signals measured in group 2 escape from an unstable vibrating state and are stabilized.

After completing execution of the pulse sequence groups in the group 1, the pulse sequence groups in the group 2 are executed. In the group 2, like the group 1, after applying an RF excitation pulse 101, a slice selection gradient magnetic field 102 and phase encode gradient magnetic field 103 to the same cross section of the phantom in the same manner as performed in the group 1, an echo signal 106 is caused to generate through application of a read out direction gradient magnetic field and the echo signal 106 is measured in a sampling period 107. Following the TR' (1), thereafter, without applying the test gradient magnetic field like the TR' (1), the same pulse sequence is repeated with repetition time TR' (=TR) in a plurality of times (n times, for example, 300 times). The application amount of the phase encode gradient magnetic field 103 used in the pulse sequence in the respective units in the group 2 is the same as that in the group 1. Since the signals measured in every repetition time TR' in the group 2 are the echo signals having the same level, and no level variation according to lapse of time is caused different from when the FID signals in the above referred to conventional art are sampled in every time point ti. Accordingly, S/N is kept constant and an eddy current having a long time constant can be measured with a high accuracy.

By making the calibration sequence consisting of the groups 1 and 2 as a unit, and repeating the unit m times (m is, for example, 64) while changing the phase encode amount every time, finally, three dimensional data set S (kx,ky,ti) containing time as variable is obtained (step 201). Wherein, kx and ky represent spatial frequency and ti represents a discrete time point (I=1, 2, 3, . . . n), when the echo signals obtained every TR' in group 2 are orderly arranged. Namely, the data set is what is resolved with regard to time of the spatial magnetic field variation in the measurement time (time for executing the group 2, TR'×n), and through setting the repetition times n and the repetition time TR', the measurement time of the magnetic field variation and time resolution can be set as desired.

Thus measured data set of magnetic field variation contains the magnetic field variation due to the eddy current induced when the test gradient magnetic field applied in group 1 falls as well as contains an influence of inhomogeneous static magnetic field and influences of eddy currents due to the gradient magnetic fields 102, 103 and 104 applied for imaging.

Therefore, by changing the test gradient magnetic field 105 in to negative polarity as illustrated by dotted line in FIG. 3, a series of calibration pulse sequence consisting of groups 1 and 2 is executed in the same manner as when the test gradient magnetic field 105 is positive polarity (step 202). Herein below, a calibration pulse sequence of which test gradient magnetic field is positive is expressed as Scan(+) and a calibration pulse sequence of which test gradient magnetic field is negative is expressed as Scan(−). Subsequently, in order to take difference between data set S+(kx,ky,ti) obtained in Scan(+) and data set S−(kx,ky,ti) obtained in Scan(−), at first, these data sets are subjected to 2D Fourier transformation for every time point ti and time resolved 2D complex image data I+(x,y,ti) and I−(x,y,ti) are obtained (steps 203 and 204). From arctangent of the ratio between the real part and the imaginary part of these complex image data, phase image data φ+(x,y,ti) and φ−(x,y,ti) for every time point are obtained (steps 205 and 206). Thereafter, by taking difference thereof, data set φ(x,y,ti)(= [φ+(x,y,ti)−φ−(x,y,ti)]/2) is obtained in which the influence of inhomogeneous static magnetic field and influences of eddy currents due to the gradient magnetic fields applied for imaging are removed (step 207). φ (x,y,ti) represents a phase variation amount during TE (echo time) at position (x,y) and time point ti caused by magnetic field variation B(x,y,ti) due to the eddy current induced when the test gradient magnetic field falls. B(x,y,ti) is given as B(x,y,ti)=φ(x,y,ti)/γ TE. Further, γ is the gyromagnetic ratio. Thereby, spatial (2D) magnetic field variation due to the eddy current induced by the test gradient magnetic field applied in group 1 is measured with time resolution of TR. Subsequently, by making use of the phase difference image which is the present measurement result, compensation currents to be supplied for the gradient magnetic field coils and the shim coils are calculated (step 208~210). Then, the compensation currents determined at step 210 are caused to flow in the gradient magnetic field coils and the shim coils when performing an actual image measurement for a subject (step 211). The currents to be flown in the gradient magnetic field coils or the shim coils are determined according to a ratio between the test gradient magnetic field and the gradient magnetic field at the time of the image measurement or a ratio between currents to be flown in to the gradient magnetic field coils for applying these gradient magnetic fields.

As the method of determining the compensation currents from the magnetic field variation for generating magnetic field for compensating the magnetic field variation, either any conventional methods or the simplified method as shown in FIG. 2 can be used. As one of the conventional methods, a common method, which is also disclosed in the above referred to JP-A-10-272120, will be explained briefly. At first, magnetic field Bt(x,y) induced by an eddy current at a predetermined time point ti is expressed as a sum of spherical harmonics as shown in the following formula;

$$Bti(x,y) = \zeta_{00,ti} + \zeta_{11,ti}x + \zeta_{12,ti}y + \zeta_{21,ti}(x^2-y_2) + \zeta_{22,ti}xy - \ldots \quad (1)$$

By performing development of these spherical harmonics at respective time points, a set of coefficients ζ of the spherical harmonics which depend on time are obtained. It is known that the respective coefficients ζ are related to the magnitudes of the eddy currents resolved with regard to space and the time constants thereof and from the relationship the compensation currents are determined. This method permits correction of high degrees of order and shows a high accuracy of correction, however, requires time for analysis and necessitates additional correction coils for the high degrees of order.

A simplified analysis method as shown in FIG. 2 will be explained. As one of examples, an instance wherein the test gradient magnetic field 105 is applied for X axis will be explained. In the present method, among the eddy currents induced when the test gradient magnetic field 105 is applied for X axis, only first order gradient component g(ti) and polarization component B0(ti) are compensated.

For this reason, when presuming that the magnetic field variation B(x,ti) at position x and time ti is as B(x,ti)=g(ti)·x+B0(ti), from magnetic field variation B(x1,ti) and B(x2,ti) at any two points in the space of the static magnetic field, g(ti) and B0(ti) are calculated according to the following formulas (step 208);

$$g(ti)=[B(x1,ti)-B(x2,ti)]/(x1-x2) \quad (2a)$$

$$B0(ti)=[B(x1,ti)+B(x2,ti)]/2-g(ti)(x1+x2) \quad (2b)$$

Herein, when two points satisfying x1=-x2 are selected, calculation of B0(ti) is further facilitated.

By making use of already known non-linear type fitting (for example, Levenberg-Marquardt method), thus calculated g(ti) and B0(ti) are resolved in to any number of time constants τ and amplitudes A and B for every time constant as in the following formulas, in which g0 and B0 are constants (step 209);

$$g(ti)=\Sigma Aj \cdot \exp(t/\tau j)+g0 \quad (3a)$$

$$B0(ti)=\Sigma Bm \cdot \exp(t/\tau m)+B0 \quad (3b)$$

The magnetic field variation due to the eddy currents is corrected by supplying compensation currents having the time constants and the amplitudes of opposite polarity to the gradient magnetic field coils or the shim coils for X axis direction (steps 210 and 211).

The present method is simple in comparison with the above referred to method using the development of spherical harmonics and moreover, the image quality deterioration due to the eddy current is sufficiently improved.

In the above explanation, although a method of compensating the eddy current caused by application of gradient magnetic field in X axis by making use of X axis as the read out axis direction, since the gradient magnetic fields are applied in three axes of x, y and z for imaging of a subject, it is necessary to compensate eddy currents induced by application of gradient magnetic fields in y axis and z axis. Such purpose can be realized by performing the measurement in the like manner while replacing the read out direction in FIG. 3 separately to y axis and z axis.

Figure 4:
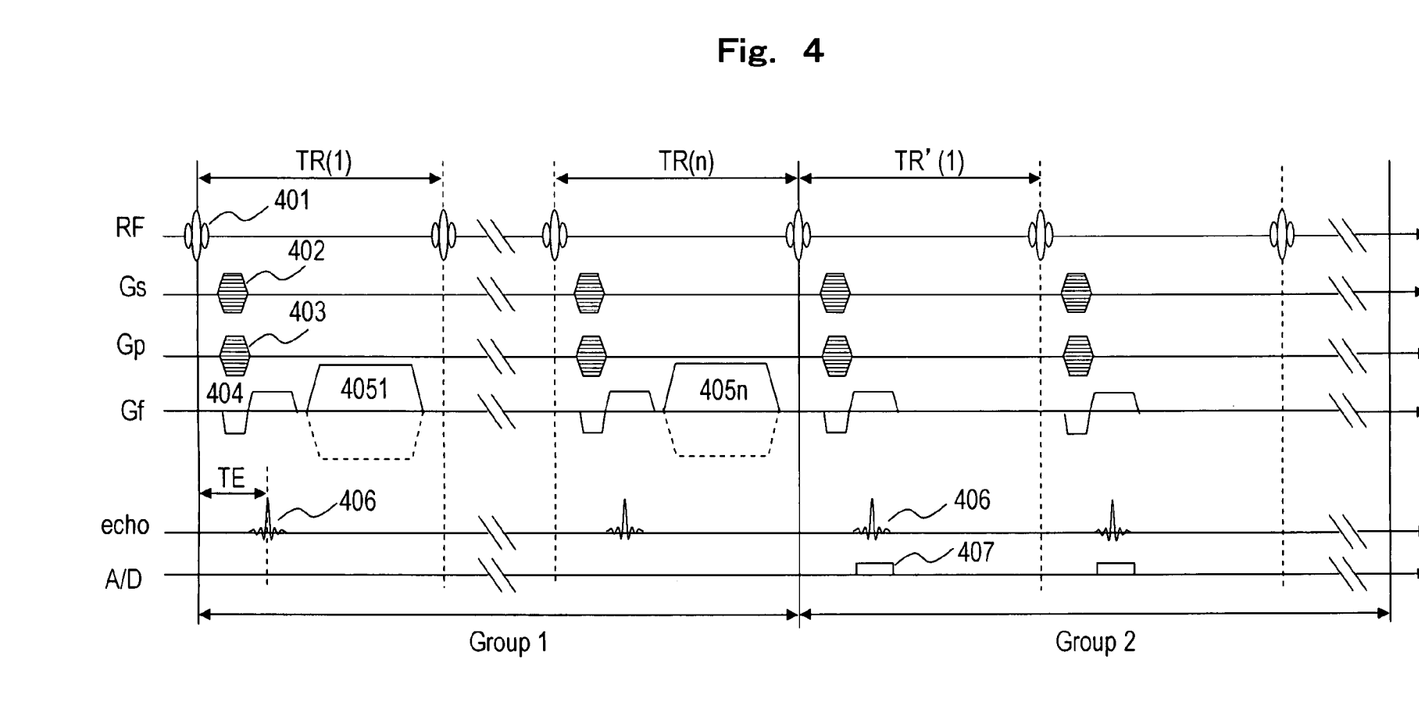
FIG. 4 is a diagram showing another example of calibration pulse sequences provided in the MRI apparatus according to the present invention.

In the above embodiment, a case where the magnetic field variation in 2D space due to eddy currents is compensated has been explained, the present invention is likely applicable the magnetic field variation in 3D space. Herein below, an embodiment for 3D case will be explained. FIG. 4 shows a calibration pulse sequence for the 3D case. In FIG. 4, a relationship between the effective gradient magnetic field intensity Geff and the eddy current is the same as that in FIG. 3, the illustration thereof is omitted.

Likely in the present embodiment, the calibration pulse sequence is constituted by a pulse sequence of group 1 in which a test gradient magnetic field 405 is applied and another pulse sequence of group 2 in which no test gradient magnetic field is applied but an echo signal 406 is measured. However, the present embodiment uses a non-selective RF excitation pulse 401 as an RF excitation pulse and encode gradient magnetic fields 402 and 403 in two axial directions.

By performing respectively the pulse sequences of groups 1 and 2 with a same encode amount, echo signals (n pieces of signals) at respective time points ti are obtained. The pulse sequence is repeated while changing the phase encode amount for respective axes and finally, 4D data set S(kx,ky,kz,ti) including variable of time is obtained. Even in this instance, in order to remove the influences of eddy currents other than the eddy currents due to the test gradient magnetic fields, two measurements of Scan(+) and Scan(-) are performed while changing the polarity of the test gradient magnetic fields.

Data set S+(kx,ky,kz,ti) and S-(kx,ky,kz,ti) obtained by the two measurements are subjected to 3D Fourier transformation for every time point, 3D complex image data is obtained and further, phase image data φ+(x,y,z,ti) and φ-(x,y,z,ti) are obtained. From the difference of these phase image data phase difference image data is prepared and magnetic field B(x,y,z,ti) at any position (x,y,z) and time ti is calculated.

For thus calculated magnetic field B(x,y,z,ti), either the analysis making use of development of spherical harmonics or the simplified analysis as explained in connection with FIG. 2 embodiment is applied and the magnetic field is resolved in to any desired number of time constant components and amplitudes for every time constant component. By supplying compensation currents having the time constants and the amplitudes (magnitudes of the currents) to the concerned gradient magnetic field coils or the shim coils, the magnetic field variation due to the eddy currents is corrected.

Herein above, although the embodiments in which the influences due to eddy currents when the gradient magnetic field falls have been explained with reference to FIGS. 2~4, the MRI apparatus according to the present invention also can correct the influences due to the eddy currents induced when the gradient magnetic field rises. Herein below, such embodiment will be explained with reference to FIG. 5.

Figure 5:
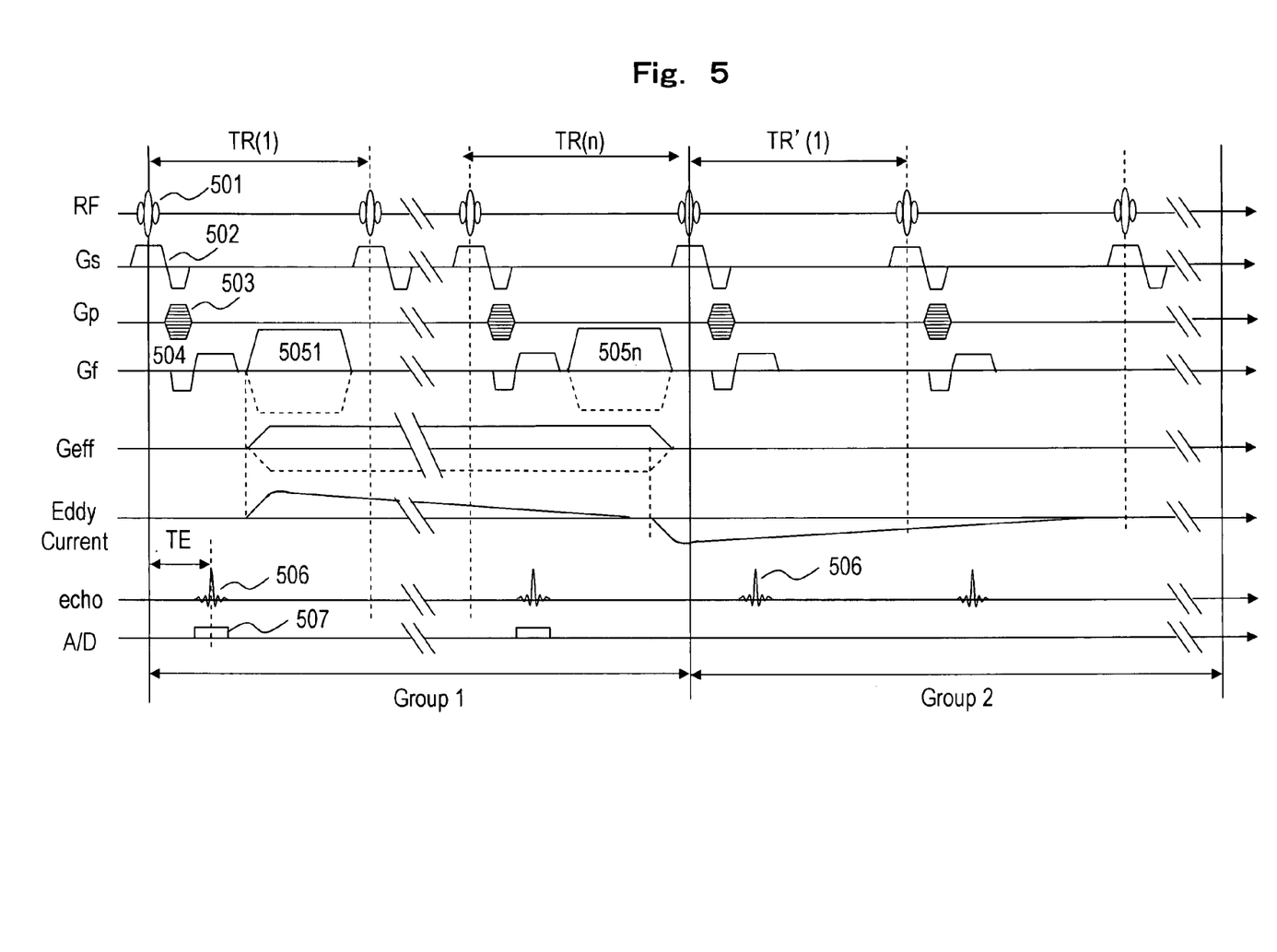
FIG. 5 is a diagram showing a still another example of calibration pulse sequences provided in the MRI apparatus according to the present invention.

FIG. 5 is a diagram showing an example of calibration pulse sequence for measuring eddy currents induced when the gradient magnetic field rises. As illustrated in the drawing, the calibration pulse sequence is also constituted by a pulse sequence of group 1 and another pulse sequence of group 2, and like the calibration pulse sequence in FIGS. 3 and 4, the pulse sequences of the respective groups include an RF excitation pulse 501 and gradient magnetic fields 502~504 for image formation. However, according to the present embodiment, in the pulse sequence of group 1 the test gradient magnetic fields 505 (5051~505n) are applied as well as prior to the application echo signals generated by an application of the read out gradient magnetic field 504 are sampled 507. In the pulse sequence of group 2, like the calibration pulse sequence in FIG. 3, no test gradient magnetic field is applied and no echo signals are sampled. Namely, as explained in connection with FIG. 3, the pulse sequence of group 2 is performed to place the nuclear spins in an SSFP state through repeating excitation with short TR and to stabilize the echo signals to be measured in group 1.

In this instance, the test gradient magnetic fields 5051~505n according to the pulse sequence of group 1 are equivalent to a continuous application of the gradient magnetic field having effective intensity Geff=Gtest×tG/TR for time TR×n times, and in the echo signals measured in the pulse sequence of group 1, a magnetic field variation due to the eddy currents induced when such test gradient magnetic fields 505 rise is contained.

In this instance, since the echo signals also contain the magnetic field variation other than the magnetic field variation due to the test gradient magnetic field (magnetic field variations due to inhomogeneous static magnetic field and gradient magnetic fields for image formation), in order to remove these variations the calibration pulse sequence is executed while changing the polarity of the test gradient magnetic field and the difference of the data set obtained in the respective measurements is taken. In this instance, according to FIG. 5 calibration pulse sequence, since time resolved data for every phase encode amount is obtained in the pulse sequence of group 1, the data is used as 3D data including variable of time to calculate the compensation currents later. A method of determining the amplitudes of the compensation currents and the time constants thereof from the phase difference data is exactly the same as the method as explained in connection with FIG. 2 embodiment.

As has been explained above, according to the present calibration pulse sequence an eddy current induced at the time when the gradient magnetic field rises up can be properly corrected. Further, it will be easily understood that when measuring both eddy currents induced at the time when the test gradient magnetic field rises up and falls down, it will be sufficient if a calibration pulse sequence formed by combining the group 1 pulse sequence as shown in FIG. 5 and the group 2 pulse sequence as shown in FIG. 3 is performed.

Further, although the calibration pulse sequence as shown in FIG. 5 shows a case wherein the phase encoding is performed for a single axis (a case of two dimension measurement), the present embodiment can also be applied to the three dimension measurement as shown in FIG. 4.

Since the principle of the present invention is to measure the echo signal containing the eddy current component during the calibration pulse sequence including the test gradient magnetic field application when measuring the eddy current induced at the time when the gradient magnetic field rises and, when measuring the eddy current induced at the time when the gradient magnetic field falls down, to measure the echo signal containing the eddy current component induced by the previous gradient magnetic field application during the calibration pulse sequence not including the test gradient magnetic field application after completing the calibration pulse sequence including the test gradient magnetic field application, the present invention can be realized by introducing a rest time in place of the group 2 pulse sequence group as shown in FIG. 5 for measuring the eddy current induced at the time when the gradient magnetic field rises up and for measuring the eddy current induced at the time when the gradient magnetic field falls down by simply applying a test gradient magnetic field in place of the group 1 pulse sequence as shown in FIG. 3, however, according to the present embodiment as explained above, since the nuclear spin is repeatedly excited in a short time, the Steady State Free Precession (SSFP) is maintained and S/N of the obtained signals is improved, as a result, the compensation is correctly performed.

In the present invention, which is based on a pulse sequence according to short TR gradient echo method, a group of pulse sequence in which a test gradient magnetic field is applied and another group of pulse sequence in which no test gradient magnetic field is applied are provided and by making use of the echo signals collected from at least one of the groups eddy currents having a long time constant can be measured in a comparatively short measurement time, moreover not only the eddy current induced at the time when the gradient magnetic field falls down but also the eddy current induced at the time when the gradient magnetic field rises up can be likely measured.

The invention claimed is:

1. A magnetic resonance imaging apparatus comprising a phantom disposed in static magnetic field;
   an eddy current measurement means which takes an image of the phantom by repeatedly executing an eddy current measurement sequence composed of an application of a test gradient magnetic field having an application time longer than a time constant of an eddy current as a measurement object and having a predetermined intensity in a predetermined axial direction and of a repetition in a plurality of times of a pulse sequence which is started in response to rising up and falling down of the test gradient magnetic field while changing phase encoding amount thereof, and successively measures a plurality of image data containing magnetic field variation information due to eddy current induced by rising up and falling down of the test gradient magnetic field in a unit of the repetition time of the pulse sequence; and
   compensation current calculating means which determines from the image data obtained in the repetition time of a current value to be flown into a magnetic field variation compensating coil at a dine when taking an image of a subject and for compensating the eddy current.

2. A magnetic resonance imaging apparatus according to claim 1, wherein the eddy current measurement means executes the eddy current measurement sequence in both positive and negative polarities of the test gradient magnetic field and performs subtracting calculation between the image data obtained.

3. A magnetic resonance imaging apparatus according to claim 1, wherein the eddy current measurement means includes a pulse sequence portion which repeatedly excites in a short repetition time nuclear spins within a predetermined region in the phantom and renders the nuclear spins in a state of steady state free precession.

4. A magnetic resonance imaging apparatus according to claim 3, wherein the pulse sequence portion which renders the nuclear spins in a state of steady state free precession is executed in succession with the repetition of the pulse sequence for taking images of the phantom.

5. A magnetic resonance imaging apparatus according to claim 1, wherein the image data containing the magnetic field variation information is phase image data.

6. A magnetic resonance imaging apparatus according to claim 1, wherein the test gradient magnetic field is applied in its actual value.

7. A magnetic resonance imaging apparatus according to claim 1, wherein the test gradient magnetic field is applied in its effective value.

8. A magnetic resonance imaging apparatus according to claim 7, wherein the test gradient magnetic field applied in its effective value is contained in a form of respective pulse like gradient magnetic field in the pulse sequence repeatedly executed.

9. A magnetic resonance imaging apparatus according to claim 1, wherein the pulse sequence repeatedly executed is a gradient echo sequence.

10. A magnetic resonance imaging apparatus according to claim 1, wherein the eddy current measurement means is performed by separately applying the test gradient magnetic field in three orthogonal axes of gradient magnetic field application directions.

11. A magnetic resonance imaging apparatus comprising:
a magnetic field generating means respectively generates static magnetic field and gradient magnetic field in a space where a subject is placed;
a signal transmission system which generates high frequency magnetic field for exciting nuclear spins in atoms constituting tissue of the subject;
a signal receiving system which detects echo signals generated from the subject by mean of the high frequency gradient magnetic field;
a signal processing system which reconstructs an image of the tissue of the subject by making use of the detected echo signals and a control means which controls the magnetic field generation means, signal transmission system, signal receiving system and the signal processing system according to a predetermined sequence, wherein
the control means is provided with as the pulse sequence a calibration pulse sequence including a pulse sequence group repeated in a plurality of times in a predetermined repetition time which includes a step of applying a test gradient magnetic field after causing to generate an echo signal through application of the high frequency excitation pulse and application of phase encoding gradient magnetic field and read out gradient magnetic field and executes the calibration sequence of two kinds in total which are formed by changing the polarity of the test gradient magnetic field with a plurality of phase encoding values, and
the signal processing system forms a phase difference image from a set of echo signals obtained through execution of the calibration pulse sequence of the two kinds as well as calculates magnitude of eddy currents induced by the test gradient magnetic field and time constants thereof based on the phase difference image.

12. A magnetic resonance imaging apparatus according to claim 11, wherein the calibration pulse sequence is constituted by a first pulse sequence group repeated in a plurality of times in a predetermined repetition dine which includes a step of applying a test gradient magnetic field after causing to generate an echo signal through application of the high frequency excitation pulse and application of phase encoding gradient magnetic field and read out gradient magnetic field and a second pulse sequence group repeated in a plurality of times in a predetermined repetition time under application of a same phase encoding amount which includes a step of measuring an echo signal after causing to generate the echo signal through application of the high frequency excitation pulse and application of phase encoding gradient magnetic field and read out gradient magnetic field, and
the signal processing system executes the first pulse sequence group and the second pulse sequence group in plurality of times while changing the phase encoding amount, forms the phase difference image from the echo signals obtained in the second pulse sequence group as well as calculates magnitude of eddy currents induced by falling down of the test gradient magnetic field and time constants thereof based on the phase difference image.

13. A magnetic resonance imaging apparatus according to claim 12, wherein the control means performs the measurement of the echo signals with the pulse sequence group including the test gradient magnetic field, and
the signal processing system forms the phase difference image from the echo signal data obtained through the pulse sequence group including the test gradient magnetic field as well as calculates magnitude of eddy currents induced by rising up of the test gradient magnetic field and time constants thereof based on the phase difference image.

14. A magnetic resonance imaging apparatus according to any one of claims 11 through 13, wherein the control means measures the magnetic field variation due to the eddy currents in a predetermined time resolution by controlling the repetition time.

15. A magnetic resonance imaging apparatus according to claim 11, wherein the control maims performs the measurement of the echo signals with the pulse sequence group including the test gradient magnetic field, and
the signal processing system forms the phase difference image from the echo signal data obtained through the pulse sequence group including the test gradient magnetic field as well as calculates magnitude of eddy currents induced by rising up of the test gradient magnetic field and time constants thereof based on the phase difference image.

16. A magnetic resonance imaging apparatus according to any one of claims 15, wherein the control means measures the magnetic field variation due to the eddy currents in a predetermined time resolution by controlling the repetition time.

17. A magnetic resonance imaging apparatus comprising:
a magnetic field generating means which respectively generates static magnetic field and gradient magnetic field in a space where a subject is placed;
a signal transmission system which generates high frequency magnetic field for exciting nuclear spins in atoms constituting tissue of the subject;
a signal receiving system which detects echo signals generated from the tissue of the subject through application of the high frequency gradient magnetic field;
a signal processing system which reconstructs an image of the tissue of the subject by making use of the detected echo signals and a control system which controls the magnetic field generation means, signal transmission system, signal receiving system and the signal processing system according to a predetermined sequence, wherein
the control system is provided with a calibration pulse sequence which is based on a pulse sequence of gradient echo method and is constituted by a first calibration pulse sequence in which is executed in a plurality of times while changing encoding amount of respective phase encode gradient magnetic field by a predetermined amount, a group set of a first pulse sequence group in which a first unit pulse sequence constituted by an application of a predetermined high frequency excitation pulse, application of phase encode gradient magnetic field and read out gradient magnetic field and after causing to generate an echo signal through these applications, application of a test gradient magnetic field having a first polarity is repeated in a plurality of times in a predetermined repetition time (TR) and a second pulse sequence group following the first pulse sequence group in which a second unit pulse sequence constituted by removing the application of the test gradient magnetic field from the first unit pulse sequence is repeated in a plurality of times in a predetermined repetition rime (TR') and by a second calibration pulse sequence in which is executed in a plurality of times while changing encoding amount of respective phase encode gradient magnetic field that in the first calibration sequence, a group a group of third pulse sequence group in which a third unit pulse sequence constituted by an application of a predetermined high frequency excitation pulse, application of phase encode gradient magnetic field and read out gradient magnetic field and after causing to generate an echo signal through these applications, application of a test gradient magnetic field having a second polarity is repeated in a plurality of dines in a predetermined repetition time (TR) and of a fourth pulse sequence group following the third pulse sequence group in which a fourth unit pulse sequence constituted by removing the application of the test gradient magnetic field from the third unit pulse sequence is repeated in a plurality of times in a predetermined repetition time (TR').

18. A magnetic resonance imaging apparatus according to claim 17, wherein the eddy current component induced at a time when the test gradient magnetic field applied rises up is measured from the difference between a phase image obtained from echo signals in the first pulse sequence groups among the first calibration poise sequence and a phase image obtained from echo signals in the third pulse sequence groups among the second calibration pulse sequence, and the eddy current component induced at a time when the test gradient magnetic field applied falls down is measured from the difference between a phase image obtained from echo signals in the second pulse sequence groups amount the first calibration pulse sequence and a phase image obtained from echo signals in the fourth pulse sequence groups among the second calibration pulse sequence.

19. A magnetic resonance imaging apparatus according to claim 17, wherein the phase encode gradient magnetic field applied during the first through the fourth unit pulse sequences is applied while changing the encoding amount in one axial direction by a predetermined amount.

20. A magnetic resonance imaging apparatus according to claim 17, wherein the phase encode gradient magnetic field applied during the first through the fourth unit pulse sequences is applied while changing die encoding amount in two axial directions by a predetermined amount.

21. A method of compensating magnetic field for a magnetic resonance imaging apparatus comprising the steps of:
applying onto a region of interest a first calibration pulse sequence in which is repeated in a plurality of times while changing encoding amount of respective phase encode gradient magnetic field by a predetermined amount, a group of first pulse sequence group in which a first unit pulse sequence constituted by an application of a predetermined high frequency excitation pulse, application of phase encode gradient magnetic field and read out gradient magnetic field and alter causing to generate an echo signal through these applications, application of a test gradient magnetic field having a first polarity is repeated in a plurality of times in a predetermined repetition time (TR) and of a second pulse sequence group following the first pulse sequence group in which a second unit pulse sequence constituted by removing the application of the test gradient magnetic field from the first unit pulse sequence is repeated in a plurality of times in a predetermined repetition time (TR'),
applying onto the same region of interest a second calibration pulse sequence in which is repeated in a plurality of times while changing encoding amount of respective phase encode gradient magnetic field following that in the first calibration sequence, a group of a third pulse sequence group in which a third unit pulse sequence constituted by an application of a predetermined high frequency excitation pulse, application of phase encode gradient magnetic field and read out gradient magnetic field and after causing to generate an echo signal through these applications, application of a test gradient magnetic field having a second polarity is repeated in a plurality of times in a predetermined repetition time (TR) and of a fourth pulse sequence group following the third pulse sequence group in which a fourth unit pulse sequence constituted by removing the application of the test gradient magnetic field from the third unit pulse sequence is repeated in a plurality of times in a predetermined repetition time (TR'),
applying onto the same region of interest a second calibration pulse sequence in which is repeated in a plurality of times while changing encoding amount of respective phase encode gradient magnetic field following that in the first calibration sequence, a group of a third pulse sequence group in which a third unit pulse sequence constituted by an application of a predetermined high frequency excitation pulse, application of phase encode gradient magnetic field and read out gradient magnetic field and after causing to generate an echo signal throughout these applications, application of a test gradient magnetic field having a second polarity is repeated in a plurality of times in a predetermined repetition time (TR) and of a fourth pulse sequence group Following the third pulse sequence group in which a fourth unit pulse sequence constituted by removing the application of the test gradient magnetic field from the third unit pulse sequence is repeated in a plurality of times in a predetermined repetition time (TR'),
calculating a first order gradient component and polarization component in the eddy current component induced at a time when the test gradient magnetic field applied rises from the difference between a phase image obtained from echo signals in the first pulse sequence groups among the first calibration pulse sequence and a phase image obtained from echo signals in the third pulse sequence groups among the second calibration pulse sequence,
calculating a first order gradient component and polarization component in the eddy current component induced at a lime when the test gradient magnetic field applied falls down from the difference between a phase image obtained from echo signals in the second pulse sequence groups among the first calibration pulse sequence and a phase image obtained from echo signals in the fourth pulse sequence groups among the second calibration pulse sequence, and
calculating a value of compensation current to be flown into a coil inducing an eddy current at a rime of image measurement based on the calculated respective first order gradient components and polarization components.

22. A method of compensating magnetic field variation due to eddy current induced by application of gradient magnetic field comprising the steps of:
(1) repeating in a plurality of times in a predetermined repetition time under application of a same phase encoding amount a process or causing to generate an echo signal through application of a high frequency excitation pulse and application of phase encoding gradient magnetic field and read out gradient magnetic field, (2) applying a test gradient magnetic field after generation of the echo signal in the process at least some of the repetitions among the plurality of repetitions, (3) collecting die echo signals in the process where the test gradient magnetic field is applied and/or the process where the test gradient magnetic field is not applied, (4) collecting a set of data of the echo signals by executing the steps of (1) through (3) while changing the phase encoding amount, (5) further collecting another set of data of the echo signals by executing the steps of (1) through (4) while changing the polarity of the test gradient magnetic field, (6) preparing respective phase images by making use of respective sets of data of the echo signals collected in the steps of (4) and (5), (7) taking a subtraction of the phase images to form a phase difference image, and (8) calculating a compensation value for compensation value for compensating the magnetic field variation due to the gradient magnetic field based on the phase difference image.

23. A method of compensating magnetic field variation due to eddy current induced by application of gradient magnetic field according to claim 22, wherein the step (8) includes the steps of calculating a first order gradient component and a polarization component from the magnetic field variation at two points in the space of the static magnetic field and performing a non-linear fining with regard to the first order gradient component and the polarization component to decompose the respective components into arbitrary number of time constant components $\tau$ and amplitude A for every rime constant.

* * * * *